United States Patent
Lee et al.

(10) Patent No.: US 11,482,590 B2
(45) Date of Patent: Oct. 25, 2022

(54) DISPLAY DEVICE WITH ALTERNATELY ARRANGED CIRCUIT AREAS AND SUB-PIXELS

(71) Applicant: LG Display Co., Ltd., Seoul (KR)

(72) Inventors: Unggi Lee, Paju-si (KR); Youngho Kim, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 165 days.

(21) Appl. No.: 17/035,249

(22) Filed: Sep. 28, 2020

(65) Prior Publication Data

US 2021/0098557 A1 Apr. 1, 2021

(30) Foreign Application Priority Data

Sep. 30, 2019 (KR) ........................ 10-2019-0121107

(51) Int. Cl.
*H01L 27/32* (2006.01)

(52) U.S. Cl.
CPC ...... *H01L 27/3276* (2013.01); *H01L 27/3223* (2013.01)

(58) Field of Classification Search
CPC ................ H01L 27/3276; H01L 27/3223
See application file for complete search history.

(56) References Cited

U.S. PATENT DOCUMENTS

| | | | | |
|---|---|---|---|---|
| 9,147,723 | B1* | 9/2015 | Lee | G02F 1/1333 |
| 2005/0162079 | A1* | 7/2005 | Sakamoto | H01L 27/3211 |
| | | | | 313/506 |
| 2011/0128262 | A1* | 6/2011 | Chaji | H01L 51/5271 |
| | | | | 313/504 |
| 2013/0112960 | A1* | 5/2013 | Chaji | H01L 51/56 |
| | | | | 257/40 |
| 2019/0019444 | A1 | 1/2019 | Jo et al. | |

FOREIGN PATENT DOCUMENTS

| | | |
|---|---|---|
| CN | 101587256 A | 11/2009 |
| CN | 102047313 A | 5/2011 |
| CN | 102714213 A | 10/2012 |
| CN | 108766993 A | 11/2018 |
| CN | 109273485 A | 1/2019 |
| JP | 2015-228361 A | 12/2015 |
| JP | 2019-20720 A | 2/2019 |
| KR | 10-2019-0070768 A | 6/2019 |
| TW | 201419247 A | 5/2014 |
| TW | 201535341 A | 9/2015 |
| WO | WO 2004/073356 A1 | 8/2004 |
| WO | WO 2019/153938 A1 | 8/2019 |

* cited by examiner

*Primary Examiner* — Lex H Malsawma
(74) *Attorney, Agent, or Firm* — Birch, Stewart, Kolasch & Birch, LLP

(57) ABSTRACT

A display device can include a substrate on which reference lines extending in a first direction are disposed, first sub pixels which include a first circuit area disposed at one side of the reference lines and a first emission area disposed at another side of the reference lines, second sub pixels which include a second emission area disposed at one side of the reference lines and a second circuit area disposed at another side of the reference lines, first data lines which extend in the first direction and are disposed to be spaced apart from the reference lines, and second data lines which extend in the first direction and are disposed to be spaced apart from the reference lines.

16 Claims, 6 Drawing Sheets

DISPLAY DEVICE WITH ALTERNATELY ARRANGED CIRCUIT AREAS AND SUB-PIXELS

CROSS-REFERENCE TO RELATED APPLICATIONS

This application claims the benefit priority to Korean Patent Application No. 10-2019-0121107 filed on Sep. 30, 2019, in the Korean Intellectual Property Office, the entire contents of which are hereby expressly incorporated by reference into the present application.

BACKGROUND

Field

The present disclosure relates to a display device, and more particularly, to a display device which improves a ripple phenomenon caused by a parasitic capacitance.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

In the meantime, the display device includes a plurality of light emitting diodes and a driving circuit and a plurality of wiring lines for driving the plurality of light emitting diodes. However, as the resolution becomes higher, there is a problem in that the number of wiring lines and driver ICs is increased, which results in the increase of a manufacturing cost. Further, as the number of wiring lines disposed in a limited area is increased, the wiring lines overlap and a parasitic capacitance is caused between the wiring lines, which results in a ripple phenomenon.

SUMMARY

An object to be achieved by the present disclosure is to provide a display device which minimizes a ripple phenomenon caused by the overlapping of a data line and a common line.

Another object to be achieved by the present disclosure is to provide a display device which minimizes a dim phenomenon in which luminance non-uniformity is generated as a polarity of a data signal is inverted at a predetermined cycle.

Still another object to be achieved by the present disclosure is to provide a display device which minimizes light leakage of light emitted from each of the plurality of sub pixels.

Objects of the present disclosure are not limited to the above-mentioned objects, and other objects, which are not mentioned above, can be clearly understood by those skilled in the art from the following descriptions.

In order to achieve the above-described objects, according to an aspect of the present disclosure, a display device includes a substrate on which a plurality of reference lines extending in a first direction is disposed; a plurality of first sub pixels which includes a first circuit area disposed at one side of the plurality of reference lines and a first emission area disposed at the other side of the plurality of reference lines; a plurality of second sub pixels which includes a second emission area disposed at one side of the plurality of reference lines and a second circuit area disposed at the other side of the plurality of reference lines; a plurality of first data lines which extends in the first direction and is disposed to be spaced apart from the plurality of reference lines; and a plurality of second data lines which extends in the first direction and is disposed to be spaced apart from the plurality of reference lines. In the first direction, the plurality of first sub pixels and the plurality of second sub pixels are alternately disposed. The first circuit area is disposed between the plurality of first data lines and the plurality of reference lines and the second circuit area is disposed between the plurality of second data lines and the plurality of reference lines. Accordingly, the reference line and the data line are disposed at both sides of the circuit area so that the reference line and the data line do not overlap and the ripple phenomenon and the dim phenomenon can be improved.

In order to achieve the above-described object, according to another aspect of the present disclosure, a display device includes a substrate in which a plurality of sub pixels including a red sub pixel, a green sub pixel, a blue sub pixel, and a white sub pixel is defined; a plurality of reference lines which extends in a first direction and overlaps the plurality of sub pixels; a plurality of data lines which extends in the first direction and is disposed between the plurality of sub pixels; a red light emitting diode which is disposed at one side of the plurality of reference lines, in the red sub pixel; a blue light emitting diode which is disposed at one side of the plurality of reference lines, in the blue sub pixel; a green light emitting diode which is disposed at the other side of the plurality of reference lines, in the green sub pixel; and a white light emitting diode which is disposed at the other side of the plurality of reference lines, in the white sub pixel. The red light emitting diode, the blue light emitting diode, the green light emitting diode, and the white light emitting diode which are adjacent to one reference line among the plurality of reference lines form a zigzag pattern. Accordingly, the plurality of light emitting diodes is disposed in a zigzag pattern with respect to the reference line so that the light leakage and the degradation of the display quality can be minimized.

Other detailed matters of the exemplary embodiments are included in the detailed description and the drawings.

According to the present disclosure, a plurality of emission areas is spaced apart from each other to minimize light leakage and color coordinate distortion.

According to the present disclosure, the plurality of emission areas is disposed in a zigzag pattern to minimize the recognition of mura according to a viewing angle.

According to the present disclosure, a repair unit intersects a reference line and a data line to reduce a parasitic capacitance in the repair unit.

According to the present disclosure, the reference line is disposed so as not to overlap the plurality of data lines so that luminance non-uniformity due to the parasitic capacitance between the reference line and the data line can be minimized.

According to the present disclosure, a reference line and a data line are disposed at both sides of the circuit area to remove an intersecting point between the reference line and the data line and improve the ripple and dim phenomenon.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
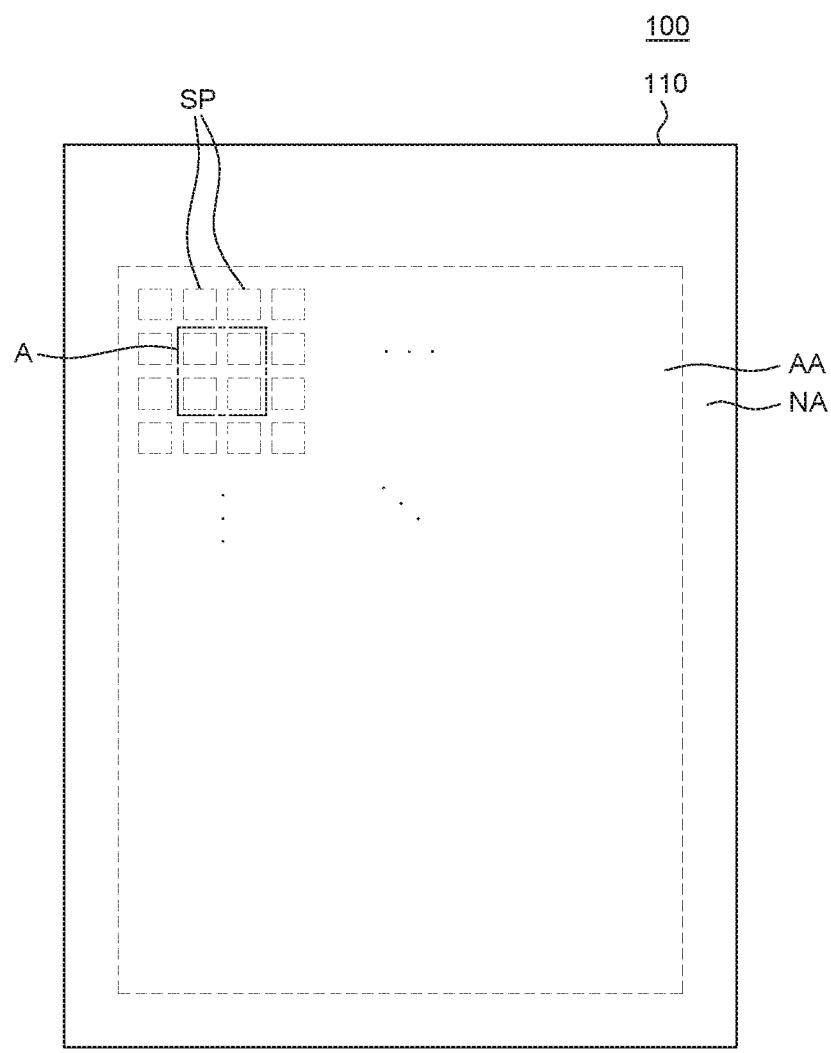
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms and may not define any order. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a plan view of a display device according to an exemplary embodiment of the present disclosure. All components of the display device according to all embodiments of the present disclosure are operatively coupled and configured.

In FIG. 1, for the convenience of description, among various components of a display device 100, only a substrate 110 and a plurality of sub pixels SP are illustrated.

The substrate 110 is a support member for supporting other components of the display device 100 and can be configured by an insulating material. For example, the substrate 110 can be formed of glass, resin, or the like. Further, the substrate 110 can be configured to include plastics such as polymer or polyimide PI or can be formed of a material having flexibility.

The substrate 110 includes a display area AA and a non-display area NA.

The display area AA is an area where images are displayed. In the display area AA, a plurality of sub pixels SP which displays images and a driving circuit which drives the plurality of sub pixels SP can be disposed. The driving circuit can include various thin film transistors, storage capacitors, and wiring lines for driving the sub pixels SP. For example, the driving circuit can include various components such as a driving transistor, a switching transistor, a sensing transistor, a storage capacitor, a scan line, and a data line, but is not limited thereto.

The non-display area NA is an area where no image is displayed and various wiring lines and driving integrated circuits (ICs) for driving the sub pixels SP disposed in the display area AA are disposed. For example, in the non-display area NA, various driving ICs such as a gate driver IC and a data driver IC can be disposed.

In the meantime, even though in FIG. 1, it is illustrated that the non-display area NA encloses the display area AA, the non-display area NA can be an area extending from any one side of the display area AA, but is not limited thereto.

A plurality of sub pixels SP is disposed in the display area AA. Each of the plurality of sub pixels SP is an individual unit which emits light and in each of the plurality of sub pixels SP, a light emitting diode and a driving circuit are formed. For example, the plurality of sub pixels SP can include a red sub pixel, a green sub pixel, a blue sub pixel, and a white sub pixel, but is not limited thereto and other variations are possible.

Hereinafter, a driving circuit of the plurality of sub pixels SP will be described in more detail with reference to FIG. 2. The sub pixels SP of FIG. 2 can be the sub pixels SP in FIG. 1.

Figure 2:
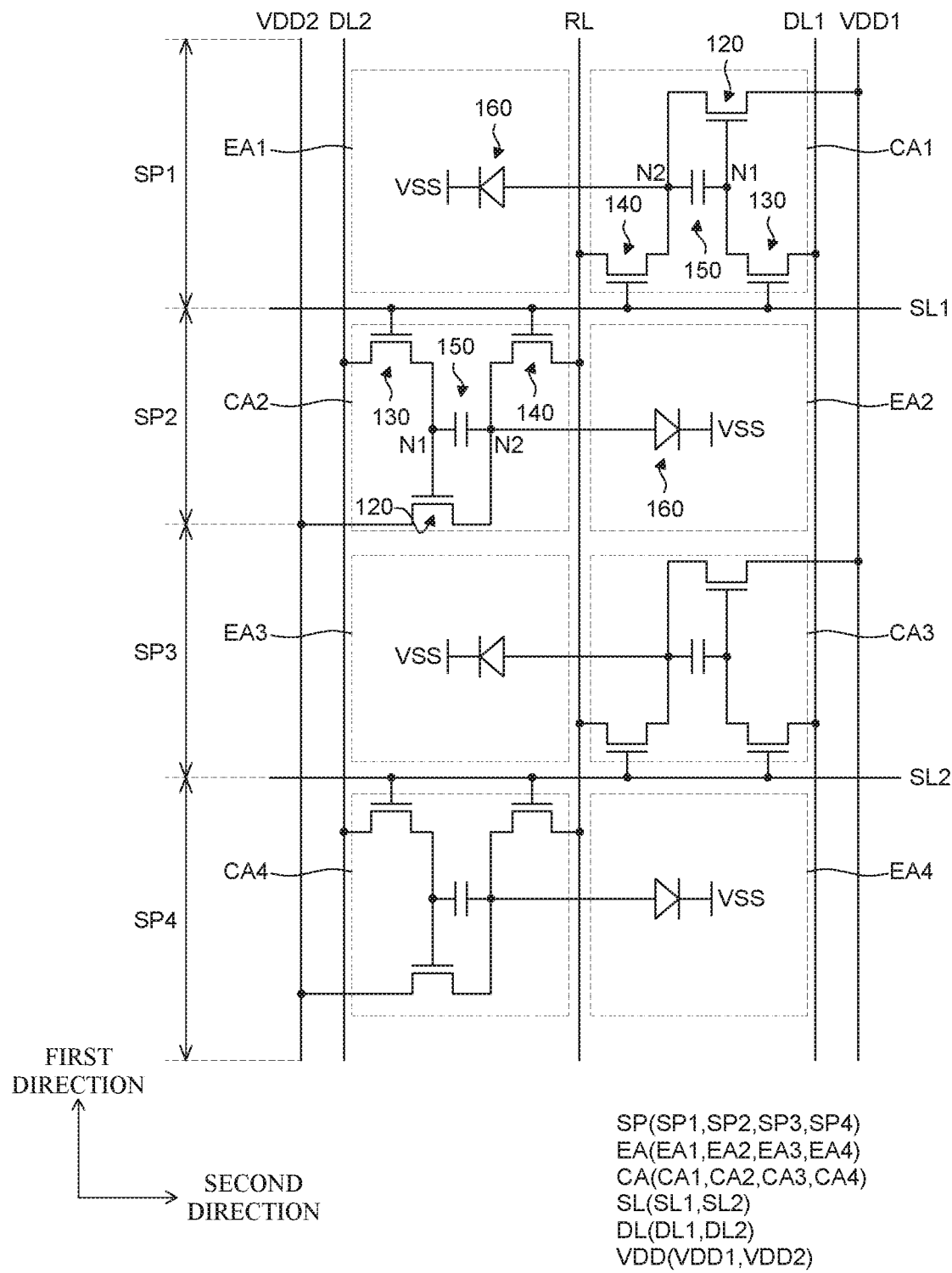
FIG. 2 is a circuit diagram of a plurality of sub pixels of a display device according to an exemplary embodiment of the present disclosure.

FIG. 2 is a circuit diagram of a plurality of sub pixels of a display device according to an exemplary embodiment of the present disclosure. Referring to FIG. 2, a driving circuit which drives each light emitting diode 160 of the plurality of sub pixels SP includes a first transistor 120, a second transistor 130, a third transistor 140, and a storage capacitor 150. A plurality of wiring lines which supplies various signals to the driving circuit includes a plurality of scan lines SL, a plurality of data lines DL, a plurality of power lines VDD and a reference line RL.

Referring to FIG. 2, the plurality of sub pixels SP includes a first sub pixel SP1, a second sub pixel SP2, a third sub pixel SP3, and a fourth sub pixel SP4. For example, the first sub pixel SP1 is a green sub pixel, the second sub pixel SP2 is a red sub pixel, the third sub pixel SP3 is a white sub pixel, and the fourth sub pixel SP4 is a blue sub pixel. In this specification, it is described that the plurality of sub pixels SP includes the first sub pixel SP1, the second sub pixel SP2, the third sub pixel SP3, and the fourth sub pixel SP4. However, the number and/or a color combination of the plurality of sub pixels SP can vary in various ways depending on a design and are not limited thereto.

Each of the plurality of sub pixels SP includes an emission area EA and a circuit area CA.

The emission area EA is an area where one color light is independently emitted and a light emitting diode 160 can be disposed therein. A first emission area EA1 of the first sub pixel SP1 is an area where a first light emitting diode among the plurality of light emitting diodes 160 is disposed, for example, can be a green emission area where a green light emitting diode is disposed to emit green light. A second emission area EA2 of the second sub pixel SP2 is an area where a second light emitting diode among the plurality of light emitting diodes 160 is disposed, for example, can be a red emission area where a red light emitting diode is disposed to emit red light. A third emission area EA3 of the third sub pixel SP3 is an area where a third light emitting diode among the plurality of light emitting diodes 160 is disposed, for example, can be a white emission area where a white light emitting diode is disposed to emit white light. A fourth emission area EA4 of the fourth sub pixel SP4 is an area where a fourth light emitting diode among the plurality of light emitting diodes 160 is disposed, for example, can be a blue emission area where a blue light emitting diode is disposed to emit blue light.

In the circuit area CA, a driving circuit for driving the plurality of light emitting diodes 160 is disposed. The driving circuit includes a first transistor 120, a second transistor 130, a third transistor 140, and a storage capacitor 150 are disposed. Since unlike the emission area EA, in the circuit area CA, light is not emitted so that the circuit area can also be defined as a non-emission area.

In a first circuit area CA1 of the first sub pixel SP1, a first driving circuit among the plurality of driving circuits is disposed and for example, a green driving circuit which drives the green light emitting diode can be disposed. In a second circuit area CA2 of the second sub pixel SP2, a second driving circuit among the plurality of driving circuits is disposed and for example, a red driving circuit which drives the red light emitting diode can be disposed. In a third circuit area CA3 of the third sub pixel SP3, a third driving circuit among the plurality of driving circuits is disposed and for example, a white driving circuit which drives the white light emitting diode can be disposed. In a fourth circuit area CA4 of the fourth sub pixel SP4, a fourth driving circuit among the plurality of driving circuits is disposed and for example, a blue driving circuit which drives the blue light emitting diode can be disposed.

Further, each of the plurality of driving circuits disposed in the first circuit area CA1 of the first sub pixel SP1, the second circuit area CA2 of the second sub pixel SP2, the third circuit area CA3 of the third sub pixels SP3, and the fourth circuit area CA4 of the fourth sub pixel SP4 can include the first transistor 120, the second transistor 130, the third transistor 140, and the storage capacitor 150.

The first sub pixels SP1, the second sub pixel SP2, the third sub pixel SP3, and the fourth sub pixel SP4 are alternately disposed in a first direction in which the reference line RL extends. For example, the reference line RL extends in the first direction and the first sub pixels SP1, the second sub pixel SP2, the third sub pixel SP3, and the fourth sub pixel SP4 are sequentially and repeatedly disposed along the first direction.

Further, in the first direction, the emission areas EA and the circuit areas CA of the plurality of sub pixels SP can be alternately disposed. In this case, in the specification, the first direction can be defined as a direction in which the reference line RL extends and a column direction. The second direction can be defined as a direction in which a scan line SL extends and a row direction, but are not limited thereto.

In the first sub pixel SP1, the first circuit area CA1 is disposed at one side of the reference line RL and the first emission area EA1 is disposed at the other side of the reference line RL. In the second sub pixel SP2, the second emission area EA2 is disposed at one side of the reference line RL and the second circuit area CA2 is disposed at the other side of the reference line RL. In the third sub pixel SP3, the third circuit area CA3 is disposed at one side of the reference line RL and the third emission area EA3 is disposed at the other side of the reference line RL. In the fourth sub pixel SP4, the fourth emission area EA4 is disposed at one side of the reference line RL and the fourth circuit area CA4 is disposed at the other side of the reference line RL.

Therefore, in the first direction, the second emission area EA2 of the second sub pixel SP2 can be disposed between the first circuit area CA1 of the first sub pixel SP1 and the third circuit area CA3 of the third sub pixel SP3. Further, the third emission area EA3 of the third sub pixel SP3 can be disposed in the second circuit area CA2 of the second sub pixel SP2 and the fourth circuit area CA4 of the fourth sub pixel SP4.

In this case, in the specification, one side can be defined as a right side and the other side (or another side) can be defined as a left side, but are not limited thereto. For example, the first circuit area CA1 is disposed at one side which is, for example, a right side of the reference line RL, and the first emission area EA1 is disposed at the other (or another) side which is, for example, a left side of the reference line RL.

In the first direction, the emission area EA of each of the plurality of sub pixels SP can be disposed to be adjacent to a circuit area CA of the other sub pixel SP. In other words, in the first direction, the emission area EA of each of the plurality of sub pixels SP and the circuit area CA of another sub pixel SP can be alternately disposed. For example, in the first direction, the first emission area EA1 can be disposed to be adjacent to the second circuit area CA2 and the second emission area EA2 can be disposed to be adjacent to the first circuit area CA.

Further, in the first direction, the second emission area EA2 is disposed between the first circuit area CA1 and the third circuit area CA3, and the third emission area EA3 is disposed between the second circuit area CA2 and the fourth circuit area CA4. The first emission area EA1, the second circuit area CA2, the third emission area EA3, and the fourth circuit area CA4 are disposed in one column. The first circuit area CAL the second emission area EA2, the third circuit area CA3, and the fourth emission area EA4 can be disposed in the other one column (i.e., in a different column).

In the second direction, the emission areas EA and the circuit areas CA of the plurality of sub pixels SP can be disposed to be adjacent to each other. For example, in the second direction, the first emission area EA1 can be disposed to be adjacent to the first circuit area CA1 and the second emission area EA2 can be disposed to be adjacent to the second circuit area CA2.

Therefore, the emission area EA of one sub pixel SP of the plurality of sub pixels SP is enclosed by the circuit area CA of other sub pixels SP. The circuit area CA of one sub pixel SP can be enclosed by the emission area EA of other sub pixels SP. The emission areas EA of the plurality of sub pixels are disposed in a zigzag pattern with respect to the reference line RL, and the circuit areas CA of the plurality of sub pixels SP can be disposed in a zigzag pattern with respect to the reference line RL. Further, the emission areas EA of the plurality of sub pixels SP can be disposed to form a mosaic pattern, and the circuit areas CA of the plurality of sub pixels SP can be disposed to form a different mosaic pattern from the mosaic pattern formed by the emission areas EA.

In the circuit area CA of the plurality of sub pixels SP, the first transistor 120, the second transistor 130, and the third transistor 140 are disposed. Each of the first transistor 120, the second transistor 130, and the third transistor 140 includes an active layer, a gate electrode, a source electrode, and a drain electrode. The first transistor 120, the second transistor 130, and the third transistor 140 can be P-type thin film transistors or N-type thin film transistors. For example, since in the P-type thin film transistor, holes flow from the source electrode to the drain electrode, the current can flow from the source electrode to the drain electrode. Since in the N-type thin film transistor, electron flows from the source electrode and the drain electrode, the current can flow from the drain electrode to the source electrode. Hereinafter, the description will be made under the assumption that the first transistor 120, the second transistor 130, and the third transistor 140 are N-type thin film transistors in which the current flows from the drain electrode to the source electrode, but is not limited thereto.

The first transistor 120 includes a first active layer, a first gate electrode, a first source electrode, and a first drain electrode. The first gate electrode is connected to a first node N1, the first source electrode is connected to a first electrode of the light emitting diode 160, and the first drain electrode is connected to a power line VDD. When a voltage of the first node N1 is higher than a threshold voltage, the first transistor 120 is turned on. When the voltage of the first node N1 is lower than the threshold voltage, the first transistor 120 is turned off. Further, when the first transistor 120 is turned on, the first transistor 120 can transmit a power signal from the power line VDD to the light emitting diode 160. The first transistor 120 can be referred to as a driving transistor.

The first transistors 120 of the first sub pixel SP1 and the third sub pixel SP3 are connected to a first power line VDD1 among the plurality of power lines VDD, and the first transistors 120 of the second sub pixel SP2 and the fourth sub pixel SP4 are connected to a second power line VDD2 among the plurality of power lines VDD. For example, the first sub pixel SP1 and the third sub pixel SP3 share the same first power line VDD1 and the second sub pixel SP2 and the fourth sub pixel SP4 share the same second power line VDD2. In this case, the first power line VDD1 and the second power line VDD2 can be high potential power lines VDD which transmit a high potential power signal.

The second transistor 130 includes a second active layer, a second gate electrode, a second source electrode, and a second drain electrode. The second gate electrode is connected to a scan line SL, the second source electrode is connected to the first node N1, and the second drain electrode is connected to a data line DL. The second transistor 130 can be turned on or off based on a scan signal from the scan line SL. When the second transistor 130 is turned on, a data signal from the data line DL can be charged in the first node N1. The second transistor 130 can be referred to as a switching transistor.

The second transistors 130 of the first sub pixel SP1 and the second sub pixel SP2 are connected to a first scan line SL1 among the plurality of scan lines SL. The second transistors 130 of the third sub pixel SP3 and the fourth sub pixel SP4 are connected to a second scan line SL2 among the plurality of scan lines SL. The first sub pixel SP1 and the second sub pixel SP2 share the same first scan line SL1 and the third sub pixel SP3 and the fourth sub pixel SP4 share the same second scan line SL2.

The second transistors 130 of the first sub pixel SP1 and the third sub pixel SP3 are connected to a first data line DL1 among the plurality of data lines DL, and the second transistors 130 of the second sub pixel SP2 and the fourth sub pixel SP4 are connected to a second data line DL2 among the plurality of data lines DL. For example, the first sub pixel SP1 and the third sub pixel SP3 share the same first data line DL1 and the second sub pixel SP2 and the fourth sub pixel SP4 share the same second data line DL2.

The third transistor 140 includes a third active layer, a third gate electrode, a third source electrode, and a third drain electrode. The third gate electrode is connected to the scan line SL, the third source electrode is connected to the second node N2, and the third drain electrode is connected to the reference line RL. The third transistor 140 can be turned on or off based on a scan signal from the scan line SL. When the third transistor 140 is turned on, a reference signal from the reference line RL can be transmitted to the second node N2. The third transistor 140 can be referred to as a sensing transistor.

The third transistors 140 of the first sub pixel SP1 and the second sub pixel SP2 are connected to the first scan line SL1. The third transistors 140 of the third sub pixel SP3 and the fourth sub pixel SP4 are connected to the second scan line SL2. In this case, the first scan line SL1 is connected to the second transistor 130 of the first sub pixel SP1 and the second sub pixel SP2, the second scan line SL2 is connected to the second transistor 130 of the third sub pixel SP3 and the fourth sub pixel SP4. For example, the second transistor 130 and the third transistor 140 of each of the plurality of sub pixels SP are electrically connected to the same scan line SL to be simultaneously turned on or turned off.

In the meantime, even though in FIG. 2, it is illustrated that the second transistor 130 and the third transistor 140 are connected to the same scan line SL, the second transistor 130 and the third transistor 140 can be connected to different scan lines SL, and are not limited thereto.

The storage capacitor 150 includes a first capacitor electrode, a second capacitor electrode, and a third capacitor electrode. Some of the first capacitor electrode, the second capacitor electrode, and the third capacitor electrode is connected to the first node N1 and the others are connected to the second node N2. The storage capacitor 150 maintains a potential difference between the first gate electrode and the first source electrode of the first transistor 120, so that a constant current can be supplied to the light emitting diode 160 to emit light for a predetermined time period.

The light emitting diode 160 includes a first electrode and a second electrode. The first electrode of the light emitting diode 160 of each of the plurality of sub pixels SP is connected to the second node N2 and the second electrode is connected to a low potential power line VSS. The light emitting diode 160 of each of the plurality of sub pixels SP is supplied with a current from the first transistor 120 to emit light. In this case, a low potential power signal from the low potential power line VSS can be a ground voltage.

In the meantime, in FIG. 2, it is described that the driving circuit of the sub pixel SP of the display device 100 according to the exemplary embodiment of the present disclosure has a 3T1C structure including three transistors 120, 130, and 140 and one storage capacitor 150. However, the number and a connection relationship of the transistors and the storage capacitor can vary in various ways and are not limited thereto.

Hereinafter, the plurality of sub pixels SP will be described in more detail with reference to FIGS. 3 and 4.

Figure 3:
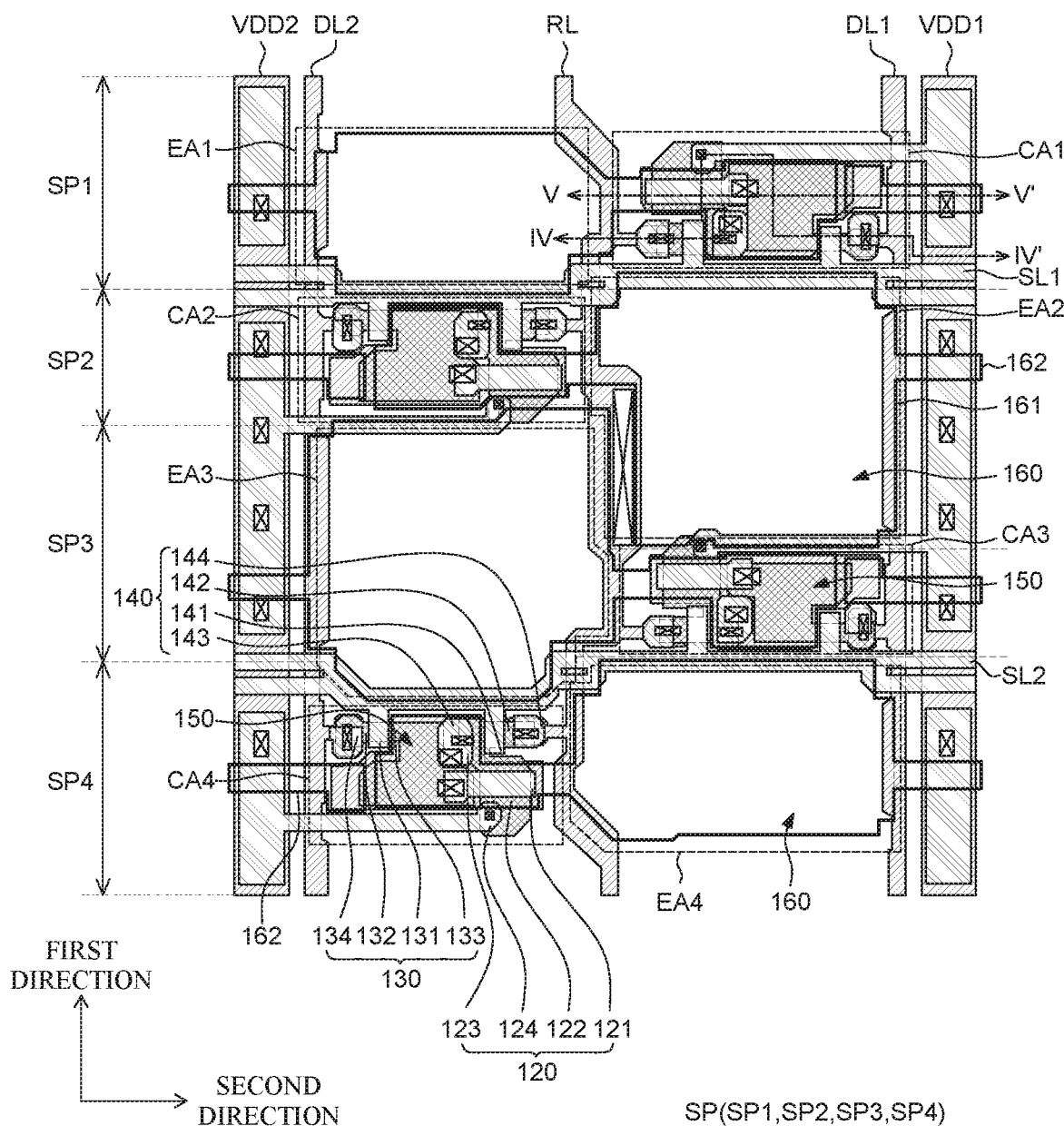
FIG. 3 is an enlarged plan view of an area A of FIG. 1.

FIG. 3 is an enlarged plan view of an area A of FIG. 1. FIG. 4 is a cross-sectional view taken along IV-IV' of FIG. 3. FIG. 5 is a cross-sectional view taken along the line V-V of FIG. 3. FIG. 3 is a plan view of a first sub pixel SP1, a second sub pixel SP2, a third sub pixel SP3, and a fourth sub pixel SP4.

Figure 4:
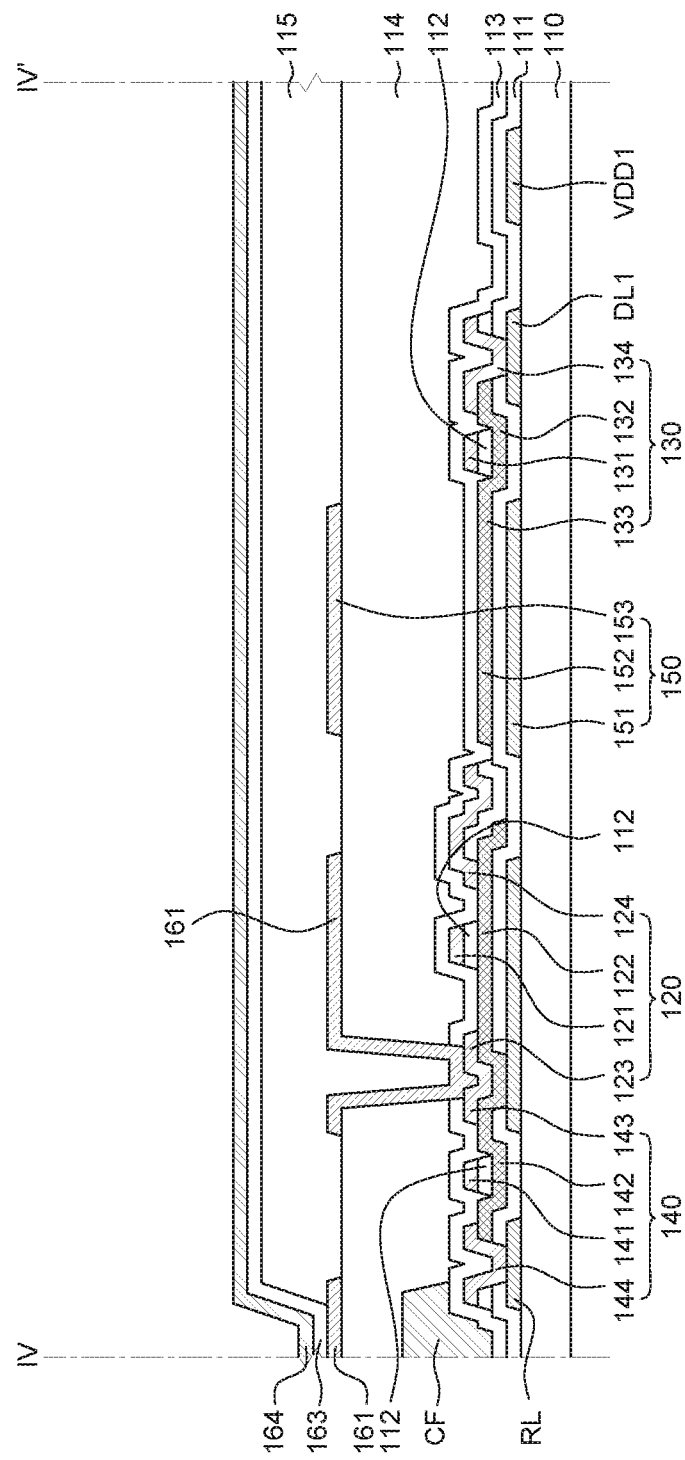
FIG. 4 is a cross-sectional view taken along IV-IV' of FIG. 3.
Figure 5:
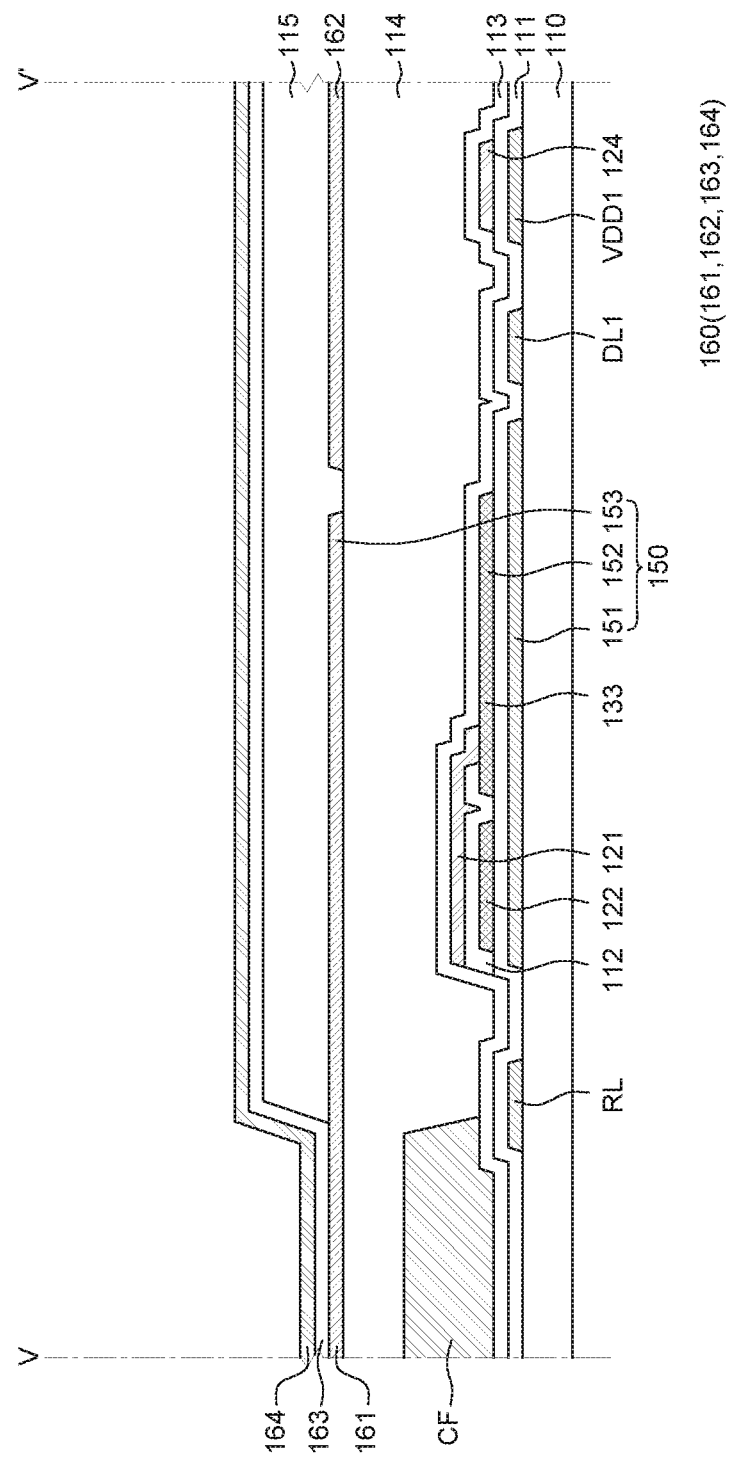
FIG. 5 is a cross-sectional view taken along the line V-V of FIG. 3.

Referring to FIGS. 3 and 4, a display device 100 according to an exemplary embodiment of the present disclosure includes a substrate 110, a plurality of scan lines SL, a plurality of data lines DL, a plurality of power lines VDD, a reference line RL, a first transistor 120, a second transistor 130, a third transistor 140, a storage capacitor 150, a buffer layer 111, a gate insulating layer 112, a passivation layer 113, a planarization layer 114, a bank 115, a light emitting diode 160, and a plurality of color filters CF. In FIG. 4, for the convenience of description, hatching of the light emitting layer 163 of the light emitting diode 160 and the bank 115 are not illustrated.

Referring to FIGS. 3 and 4, on the substrate 110, the plurality of power lines VDD, the plurality of data lines DL, and the reference line RL is disposed. The plurality of power lines VDD and the plurality of data lines DL extend in the first direction between the plurality of sub pixels SP. The reference line RL extends in the first direction is disposed to overlap the plurality of sub pixels SP. Specifically, the plurality of power lines VDD and the plurality of data lines DL are disposed on both sides of the plurality of sub pixels SP. Further, the reference line RL is disposed to traverse the plurality of sub pixels SP. For example, the reference line RL can be disposed to extend in the first direction between the circuit area CA and the emission area EA of each of the plurality of sub pixels SP.

The plurality of power lines VDD, the plurality of data lines DL, and the reference line RL are disposed on the same layer and formed of the same conductive material. For example, the plurality of power lines VDD, the plurality of data lines DL, and the reference line RL can be configured by a conductive material such as copper (Cu), aluminum (Al), molybdenum (Mo), nickel (Ni), titanium (Ti), or chrome (Cr), or an alloy thereof (an alloy of any of these materials), but are not limited thereto.

The plurality of power lines VDD are lines which transmit the power signal to the plurality of sub pixels SP. The plurality of power lines VDD include a first power line VDD1 and a second power line VDD2. The first power line VDD1 and the second power line VDD2 extend in the first direction and are disposed to be spaced apart from the reference line RL. The first power line VDD1 is disposed at one side of the plurality of sub pixels SP to be electrically connected to the first transistors 120 of the circuit areas CA1 and CA3 of the first sub pixel SP1 and the third sub pixel SP3. The second power line VDD2 is disposed at the other side of the plurality of sub pixels SP to be electrically connected to the first transistors 120 of the circuit areas CA2 and CA4 of the second sub pixel SP2 and the fourth sub pixel SP4.

The plurality of data lines DL are lines which transmit the data signal to the plurality of sub pixels SP. The plurality of data lines DL includes a first data line DL1 and a second data line DL2. The first data line DL1 and the second data line DL2 extend in the first direction and are disposed to be spaced apart from the reference line RL. For example, the first data line DL1 can be disposed to be spaced apart from the reference line RL with the first circuit area CA1 and the third circuit area CA3 therebetween. Further, the second data line DL2 can be disposed to be spaced apart from the reference line RL with the second circuit area CA2 and the fourth circuit area CA4 therebetween.

The first data line DL1 is disposed at one side of the plurality of sub pixels SP to be electrically connected to the second transistors 130 of the circuit areas CA1 and CA3 of the first sub pixel SP1 and the third sub pixel SP3. The second data line DL2 is disposed at the other side of the plurality of sub pixels SP to be electrically connected to the second transistors 130 of the circuit areas CA2 and CA4 of the second sub pixel SP2 and the fourth sub pixel SP4.

The first sub pixel SP1 which is the green sub pixel and the third sub pixel SP3 which is the white sub pixel share the first data line DL1, and the second sub pixel SP2 which is the red sub pixel and the fourth sub pixel SP4 which is the blue sub pixel share the second data line DL2. Therefore, the display device 100 according to the exemplary embodiment of the present disclosure can be a display device 100 having a double rate driving (DRD) structure in which sub pixels SP which emit light having different colors share one data line DL.

Specifically, the DRD structure is a structure in which sub pixels SP which emit light having different colors share one data line DL. Therefore, according to the DRD structure, the number of data driver ICs and data lines DL can be reduced while maintaining the same resolution. For example, among the plurality of sub pixels SP, the first sub pixel SP1 which is the green sub pixel and the third sub pixel SP3 which is the white sub pixel can share one first data line DL1.

In this case, in order to reduce heat generation and power consumption, data signals to be supplied to the data lines DL can be supplied to the plurality of sub pixels SP with a polarity which is inverted every predetermined time period. For example, after supplying a green data signal having a positive polarity to N first sub pixels SP1 through the first data line DL1 for a predetermined time period, a white data signal having a negative polarity can be supplied to N third sub pixels SP3 through the first data line DL1 for a predetermined time period. For example, after supplying a data signal having a specific polarity to the sub pixels SP which emit light having the same color for a predetermined time period, the polarity of the data signal is inverted to supply the data signal to the sub pixels SP which emit light having the different color. Therefore, according to the DRD structure, the data signal is supplied to sub pixels SP of different colors via one data line by inverting the polarity of the data signal every predetermined time period, so that the heat generation and power consumption can be reduced.

In the meantime, the plurality of power lines VDD and the plurality of data lines DL which extend in the first direction between the plurality of sub pixels SP can be disposed to be adjacent to each other. Specifically, the first power line VDD1 disposed at one side of the plurality of sub pixels SP can be disposed to be adjacent to the first data line DL1. Further, the second power line VDD2 disposed at the other side of the plurality of sub pixels SP can be disposed to be adjacent to the second data line DL2.

The reference line RL transmits a reference signal to each of the plurality of sub pixels SP and is disposed to traverse the plurality of sub pixels SP. The reference line RL can be disposed to overlap the plurality of sub pixels SP. The reference line RL is disposed to extend in the first direction between the circuit area CA and the emission area EA of each of the plurality of sub pixels SP.

The reference line RL can be electrically connected to the driving circuit at one side or the other side of the circuit area CA of each of the plurality of sub pixels SP. For example, the reference line RL is disposed at the other side of the first circuit area CA1 of the first sub pixel SP1 so that the reference line RL and the first driving circuit can be electrically connected at the other side of the first circuit area CAE The reference line RL is disposed at one side of the second circuit area CA2 of the second sub pixel SP2 so that the reference line RL and the second driving circuit can be electrically connected at one side of the second circuit area CA2.

The first capacitor electrode 151 which is formed on the same conductive material as the plurality of power lines VDD, the plurality of data lines DL, and the reference line RL is disposed on the same layer as the plurality of power lines VDD, the plurality of data lines DL, and the reference line RL on the substrate 110. For example, the first capacitor electrode 151 can be configured by a conductive material such as copper (Cu), aluminum (Al), molybdenum (Mo), nickel (Ni), titanium (Ti), or chrome (Cr), or an alloy thereof (an alloy of any of these materials), but it is not limited thereto. The first capacitor electrode 151 is included in the storage capacitor 150 and is electrically connected to the first source electrode 123 of the first transistor 120, which will be described in more detail below.

The buffer layer 111 is disposed on the plurality of power lines VDD, the plurality of data lines DL, the reference line RL, and the first capacitor electrode 151. The buffer layer 111 can reduce permeation of moisture or impurities from the substrate 110. The buffer layer 111 can be configured by a single layer or a double layer of silicon oxide SiOx or silicon nitride SiNx, but is not limited thereto. However, the buffer layer 111 can be omitted depending on a type of substrate 110 or a type of the thin film transistor, but is not limited thereto.

The first transistor 120 is disposed in the circuit area CA of the plurality of sub pixels SP. The first transistor 120 includes a first gate electrode 121, a first active layer 122, a first source electrode 123, and a first drain electrode 124. The first transistor 120 which is electrically connected to the first electrode 161 of light emitting diode 160 and the power line VDD can be a driving transistor.

First, the first active layer 122 is disposed on the buffer layer 111. At least a part of the first active layer 122 can be disposed so as to overlap the first capacitor electrode 151.

The first active layer 122 can be formed of a semiconductor material such as an oxide semiconductor, amorphous silicon, or polysilicon, but is not limited thereto. For example, when the first active layer 122 is formed of an oxide semiconductor, the first active layer 122 is formed by a channel region, a source region, and a drain region, and the source region and the drain region can be conductive regions, but are not limited thereto.

In the meantime, the first capacitor electrode 151 can serve as a light shielding layer which blocks light incident onto the first active layer 122. For example, when light is irradiated onto the first active layer 122, a leakage current is generated so that the reliability of the first transistor 120 can be degraded. In this case, the first capacitor electrode 151 which is formed of a conductive material which is not transparent is disposed below the first active layer 122 to block light which is incident onto the first active layer 122 from the lower portion of the substrate 110 so that the reliability of the first transistor 120 can be improved.

The gate insulating layer 112 is disposed on the first active layer 122 to insulate the first active layer 122 and the first gate electrode 121 from each other. For example, the gate insulating layer 112 can be configured by a single layer or a double layer of silicon oxide SiOx or silicon nitride SiNx, but is not limited thereto.

The first drain electrode 124 is disposed on the gate insulating layer 112. The first drain electrode 124 is electrically connected to the plurality of power lines VDD and the first active layer 122. Specifically, the first drain electrode 124 can be electrically connected to the power line VDD through contact holes formed on the buffer layer 111 and the gate insulating layer 112. For example, the first drain electrode 124 of the first circuit area CA1 extends to one side of the first circuit area CA1 to be electrically connected to the first power line VDD1. The first drain electrode 124 of the second circuit area CA2 extends to the other side of the second circuit area CA2 to be electrically connected to the second power line VDD2. For example, the first drain electrode 124 can be configured by a conductive material such as copper (Cu), aluminum (Al), molybdenum (Mo), nickel (Ni), titanium (Ti), or chrome (Cr), or an alloy thereof (an alloy of any of these materials), but is not limited thereto.

Further, the first drain electrode 124 can be electrically connected to the first active layer 122 through a contact hole formed on the gate insulating layer 112. Accordingly, the first drain electrode 124 can transmit the power signal from the power line VDD to the first active layer 122 and the first source electrode 123.

In each of the plurality of sub pixels SP, the first gate electrode 121 is disposed on the gate insulating layer 112 so as to overlap the first active layer 122. For example, the first gate electrode 121 can be configured by a conductive material such as copper (Cu), aluminum (Al), molybdenum (Mo), nickel (Ni), titanium (Ti), or chrome (Cr), or an alloy thereof (an alloy of any of these materials), but is not limited thereto.

The first source electrode 123 which is spaced apart from the first gate electrode 121 and the first drain electrode 124 is disposed on the gate insulating layer 112. The first source electrode 123 can be electrically connected to the first active layer 122 through a contact hole formed on the gate insulating layer 112. The first source electrode 123 can be disposed on the same layer as the first gate electrode 121 and the first drain electrode 124 and can be formed of the same conductive material as the first gate electrode 121 and the first drain electrode 124, but is not limited thereto. For example, the first source electrode 123 can be configured by copper (Cu), aluminum (Al), molybdenum (Mo), nickel (Ni), titanium (Ti), or chrome (Cr), or an alloy thereof (an alloy of any of these materials), but is not limited thereto.

In the meantime, the first active layer 122 can be electrically connected to the first capacitor electrode 151 through a contact hole formed on the buffer layer 111. Further, the first source electrode 123 which is electrically connected to the first active layer 122 can also be electrically connected to the first capacitor electrode 151. Accordingly, the first capacitor electrode 151 can be electrically connected to the second node N2 between the first transistor 120 and the light emitting diode 160.

The second transistor 130 is disposed in the circuit area CA of the plurality of sub pixels SP. The second transistor 130 includes a second gate electrode 131, a second active layer 132, a second source electrode 133, and a second drain electrode 134. The second transistor 130 which is electrically connected to the scan line SL, the data line DL, and the first gate electrode 121 of the first transistor 120 can be a switching transistor.

The second active layer 132 is disposed between the buffer layer 111 and the gate insulating layer 112. The second active layer 132 can be electrically connected to the second drain electrode 134 through a contact hole formed on the gate insulating layer 112. The second active layer 132 can be formed of a semiconductor material such as an oxide semiconductor, amorphous silicon, or polysilicon, but is not limited thereto.

The second source electrode 133 is disposed between the buffer layer 111 and the gate insulating layer 112. The second source electrode 133 can be integrally formed with the second active layer 132. For example, when a scan signal is applied to the second gate electrode 131, the second source electrode 133 which is integrally formed with the second active layer 132 and is conducted can transmit the data signal from the data line DL to the first gate electrode 121 of the first transistor 120. Further, the second source electrode 133 can be electrically connected to the second capacitor electrode 152 of the storage capacitor 150, which will be described below.

The second drain electrode 134 is disposed on the gate insulating layer 112. The second drain electrode 134 is electrically connected to one data line DL among the plurality of data lines DL. The second drain electrode 134 can be electrically connected to the data line DL through a contact hole formed on the buffer layer 111. For example, the second drain electrode 134 of the first sub pixel SP1 is electrically connected to the first data line DL1 disposed at one side of the first sub pixel SP1 and the second drain electrode 134 of the second sub pixel SP2 is electrically connected to the second data line DL2 disposed at the other side of the second sub pixel SP2. For example, the second drain electrode 134 can be configured by a conductive material such as copper (Cu), aluminum (Al), molybdenum (Mo), nickel (Ni), titanium (Ti), or chrome (Cr), or an alloy thereof (an alloy of any of these materials), but is not limited thereto.

The second gate electrode 131 is disposed on the gate insulating layer 112 to overlap the second active layer 132. For example, the second gate electrode 131 can be configured by a conductive material such as copper (Cu), aluminum (Al), molybdenum (Mo), nickel (Ni), titanium (Ti), or chrome (Cr), or an alloy thereof (an alloy of any of these materials), but is not limited thereto.

The second gate electrode 131 extends from one scan line SL among the plurality of scan lines SL. The second gate electrode 131 can be integrally formed with the scan line SL. Therefore, the second gate electrode 131 and the scan line SL can be formed of the same conductive material. For example, the scan line SL can be configured by a conductive material such as copper (Cu), aluminum (Al), molybdenum (Mo), nickel (Ni), titanium (Ti), or chrome (Cr), or an alloy thereof (an alloy of any of these materials), but is not limited thereto.

The plurality of scan lines SL transmits a scan signal to each of the plurality of sub pixels SP and is disposed on the gate insulating layer 112. The plurality of scan lines SL extends in the second direction between the plurality of sub pixels SP. The plurality of scan lines SL can be electrically connected to the driving circuit at an upper side or a lower side of the circuit area CA of each of the plurality of sub pixels SP. For example, a first scan line SL1 is disposed between the first circuit area CA1 of the first sub pixel SP1 and the second circuit area CA2 of the second sub pixel SP2. The second transistor 130 and the third transistor 140 of the first circuit area CA1 and the second circuit area CA2 can be electrically connected to the first scan line SL1. A second scan line SL2 is disposed between the third circuit area CA3 of the third sub pixel SP3 and the fourth circuit area CA4 of the fourth sub pixel SP4. The second transistor 130 and the third transistor 140 of the third circuit area CA3 and the fourth circuit area CA4 can be simultaneously electrically connected to the second scan line SL2. For example, the first sub pixel SP1 and the second sub pixel SP2 share the first scan line SL1 and the third sub pixel SP3 and the fourth sub pixel SP4 share the second scan line SL2.

The third transistor 140 is disposed in the circuit area CA of the plurality of sub pixels SP. The third transistor 140 includes a third gate electrode 141, a third active layer 142, a third source electrode 143, and a third drain electrode 144. The third transistor 140 which is electrically connected to reference line RL, the scan line SL, and the storage capacitor 150 can be a sensing transistor.

First, the third active layer 142 is disposed between the buffer layer 111 and the gate insulating layer 112. The third active layer 142 can be electrically connected to the third drain electrode 144 and the third source electrode 143 through a contact hole formed on the gate insulating layer 112. The third active layer 142 can be formed of a semiconductor material such as an oxide semiconductor, amorphous silicon, or polysilicon, but is not limited thereto.

The third drain electrode 144 is disposed on the gate insulating layer 112. The third drain electrode 144 is electrically connected to the reference line RL. The third drain electrode 144 can be electrically connected to the reference line RL through contact holes formed on the gate insulating layer 112 and the buffer layer 111. For example, the third drain electrode 144 can be configured by a conductive material such as copper (Cu), aluminum (Al), molybdenum (Mo), nickel (Ni), titanium (Ti), or chrome (Cr), or an alloy thereof (an alloy of any of these materials), but is not limited thereto.

The third gate electrode 141 is disposed on the gate insulating layer 112 to overlap the third active layer 142. For example, the third gate electrode 141 can be configured by a conductive material such as copper (Cu), aluminum (Al), molybdenum (Mo), nickel (Ni), titanium (Ti), or chrome (Cr), or an alloy thereof (an alloy of any of these materials), but is not limited thereto.

The third gate electrode 141 extends from one scan line SL among the plurality of scan lines SL. Specifically, third gate electrode 141 can be integrally formed with the scan line SL. In this case, the scan line SL is also integrally formed with the second gate electrode 131 so that the second transistor 130 and the third transistor 140 can share one scan line SL. For example, when the scan signal is applied to the scan line SL, the second transistor 130 and the third transistor 140 can be simultaneously turned on or turned off. It is described that in the display device 100 according to the exemplary embodiment of the present disclosure, the second transistor 130 and the third transistor 140 share one scan line SL. However, the second transistor 130 and the third transistor 140 can be connected to different scan lines SL to be individually turned on or turned off, but are not limited thereto.

The third source electrode 143 is disposed on the gate insulating layer 112 so as to be spaced apart from the third gate electrode 141 and the third drain electrode 144. The third source electrode 143 can be electrically connected to the third active layer 142 through a contact hole formed on the gate insulating layer 112. For example, the third source electrode 143 can be configured by a conductive material such as copper (Cu), aluminum (Al), molybdenum (Mo), nickel (Ni), titanium (Ti), or chrome (Cr), or an alloy thereof (an alloy of any of these materials), but is not limited thereto.

In the meantime, the third source electrode 143 can be integrally formed with the first source electrode 123. The third source electrode 143 can be integrally formed with the first source electrode 123 to be electrically connected. In this case, as described above, the first source electrode 123 can be electrically connected to the first capacitor electrode 151 and the first active layer 122 through contact holes formed on the buffer layer 111 and the gate insulating layer 112. Therefore, the third source electrode 143 can also be electrically connected to the first capacitor electrode 151 through the first source electrode 123 and the first active layer 122.

Next, the passivation layer 113 is disposed on the first transistor 120, the second transistor 130, the third transistor 140, the first capacitor electrode 151 and the second capacitor electrode 152 of the storage capacitor 150, the plurality of power lines VDD, the plurality of data lines DL, the reference line RL, and the plurality of scan lines SL. The passivation layer 113 is an insulating layer for protecting components below the passivation layer 113. For example, the passivation layer 113 can be configured by a single layer or a double layer of silicon oxide SiOx or silicon nitride SiNx, but is not limited thereto. Further, the passivation layer 113 can be omitted depending on the exemplary embodiment.

Referring to FIG. 4, the plurality of color filters CF is disposed on the passivation layer 113. Specifically, the plurality of color filters CF is disposed so as to overlap the emission area EA of each of the plurality of sub pixels SP. The plurality of color filters CF can include a red color filter, a blue color filter, and a green color filter. For example, the green color filter can be disposed between the substrate 110 and the planarization layer 114 in the first emission area EA1 of the first sub pixel SP1 which is the green sub pixel. The red color filter can be disposed between the substrate 110 and the planarization layer 114 in the second emission area EA2 of the second sub pixel SP2 which is the red sub pixel. The blue color filter can be disposed between the substrate 110 and the planarization layer 114 in the fourth emission area EA4 of the fourth sub pixel SP4 which is the blue sub pixel.

The planarization layer 114 is disposed on the passivation layer 113 and the plurality of color filters CF. The planarization layer 114 is an insulating layer which planarizes an upper portion of the substrate 110 on which the first transistor 120, the second transistor 130, the third transistor 140, the first capacitor electrode 151, the second capacitor electrode 152, the plurality of power lines VDD, the plurality of data lines DL, the reference line RL, and the plurality of scan lines SL are disposed. The planarization layer 114 can be formed of an organic material, and for example, can be configured by a single layer or a double layer of polyimide or photo acryl, but is not limited thereto.

Referring to FIGS. 3 and 4, the light emitting diode 160 is disposed in each of the plurality of sub pixels SP. The light emitting diode 160 is disposed on the planarization layer 114 in the emission area EA of each of the plurality of sub pixels SP. The light emitting diode 160 includes a first electrode 161, a repair unit 162, a light emitting layer 163, and a second electrode 164.

The first electrode 161 is disposed on the planarization layer 114 in the emission area EA. The first electrode 161 supplies holes to the light emitting layer 163 so that the first electrode 161 can be formed of a conductive material having a high work function and can be referred to as an anode. For example, the first electrode 161 can be formed of a transparent conductive material such as indium tin oxide (ITO) and indium zinc oxide (IZO), but is not limited thereto.

In the meantime, when the display device 100 according to the exemplary embodiment of the present disclosure is a top emission type, a reflective layer which is formed of metal material having an excellent reflection efficiency, such as aluminum (Al) or silver (Ag) can be added below the first electrode 161. Therefore, the light emitted from the light emitting layer 163 is reflected to the first electrode 161 to be upwardly directed, for example, to be directed to the second electrode 164. In contrast, when the display device 100 is a bottom emission type, the first electrode 161 can be only formed of a transparent conductive material. Hereinafter, the description will be made under the assumption that the display device 100 according to the exemplary embodiment of the present disclosure is a bottom emission type.

The bank 115 is disposed on the first electrode 161 and the planarization layer 114. The bank 115 is an insulating layer which separates adjacent sub pixels SP. The bank 115 is disposed on the first electrode 161 and the planarization layer 114 in the circuit area CA of the plurality of sub pixels SP. The bank 115 can be disposed to open a part of the first electrode 161 which overlaps the emission area EA. For example, the bank 115 can be formed of an insulating material such as polyimide, acryl, or benzocyclobutene (BCB)-based resin, but it is not limited thereto.

In the emission area EA and the circuit area CA, the light emitting layer 163 is disposed on the first electrode 161. The light emitting layer 163 can be formed as one layer over the plurality of sub pixels SP. For example, the light emitting layers 163 of the plurality of sub pixels SP are connected to be integrally formed. The light emitting layer 163 can be configured as one light emitting layer 163 or can have a structure in which a plurality of light emitting layers 163 emitting different color light is laminated. The light emitting layer 163 can further include an organic layer such as a hole injection layer, a hole transport layer, an electron transport layer, or an electron injection layer, but is not limited thereto.

In the entire emission area EA and circuit area CA, the second electrode 164 can be disposed on the light emitting layer 163. The second electrode 164 supplies electrons to the light emitting layer 163 so that the second electrode 164 can be formed of a conductive material having a low work function and can be referred to as a cathode. The second electrode 164 can be formed as one layer over the plurality of sub pixels SP. For example, the second electrodes 164 of the plurality of sub pixels SP are connected to be integrally formed. For example, the second electrode 164 can be formed of a transparent conductive material such as indium tin oxide (ITO) and indium zinc oxide (IZO) or ytterbium (Yb) alloy and can further include a metal doping layer, but is not limited thereto. Even though not illustrated in FIGS. 3 and 4, the second electrode 164 of the light emitting diode 160 can be electrically connected to the low potential power line VSS to be supplied with a low potential power signal.

Referring to FIGS. 3 to 5, the light emitting diode 160 includes the repair unit 162 which extends to the circuit area CA of the adjacent sub pixel SP from the first electrode 161. The repair unit 162 extends to the circuit area CA of a sub pixel which emits the light having the same color, among adjacent sub pixels SP. For example, the repair unit 162 of a first sub pixel SP1 which is one of the plurality of first sub pixels SP1 can extend toward the first circuit area CA1 of another first sub pixels SP1 adjacent to one first sub pixel SP1 at left and right sides. The repair unit 162 can extend toward the first capacitor electrode 151 of the circuit area CA of the adjacent sub pixel SP.

At least a part of the repair unit 162 can overlap the first capacitor electrode 151 with the planarization layer 114, the passivation layer 113, and the buffer layer 111 therebetween. The part of the repair unit 162 extends toward the first capacitor electrode 151 of the adjacent sub pixel SP and can intersect, for example, overlap the plurality of power lines VDD and the plurality of data lines DL extending in the first direction between the plurality of sub pixels SP. In this case, the part of the repair unit 162 can intersect the plurality of power lines VDD and the plurality of data lines DS with the planarization layer 114, the passivation layer 113, and the buffer layer 111 therebetween.

If defects occur in the plurality of transistors 120, 130, and 140 and the storage capacitor 150 of the circuit area CA, laser is irradiated onto the repair unit 162 extending toward the first capacitor electrode 151 of the adjacent sub pixel SP to electrically connect the repair unit 162 to the first capacitor electrode 151 of the adjacent sub pixel SP. At this time, the first capacitor electrode 151 is electrically connected between the first source electrode 123 of the first transistor 120 and the first electrode 161 of the light emitting diode 160, for example, at a point where current which is supplied to the light emitting diode 160 from the first transistor 120 flows. Therefore, even though a defect occurs in the driving circuit, the first transistor 120 and the repair unit 162 can be electrically connected by the first capacitor electrode 151 of the adjacent sub pixel SP and two light emitting diodes 160 can be driven by one driving circuit.

The storage capacitor 150 is disposed in the circuit area CA of the plurality of sub pixels SP. The storage capacitor 150 can store a voltage between the first gate electrode 121 and the first source electrode 123 of the first transistor 120 to allow the light emitting diode 160 to continuously maintain a constant state for one frame. The storage capacitor 150 includes a first capacitor electrode 151, a second capacitor electrode 152, and a third capacitor electrode 153.

The first capacitor electrode 151 is disposed between the substrate 110 and the buffer layer 111. The first capacitor electrode 151 can be electrically connected to the first source electrode 123 of the first transistor 120 and the third source electrode 143 of the third transistor 140 through the first active layer 122 of the first transistor 120. Accordingly, the first capacitor electrode 151 can be electrically connected to the second node N2 between the first transistor 120, the third transistor 140, and the light emitting diode 160.

The second capacitor electrode 152 is disposed on the first capacitor electrode 151 and the buffer layer 111 so as to overlap the first capacitor electrode 151. The first capacitor electrode 151 and the second capacitor electrode 152 can overlap with the buffer layer 111 therebetween. The second capacitor electrode 152 can be integrally formed with the second source electrode 133 and the second active layer 132. The second capacitor electrode 152 can be electrically connected to the first gate electrode 121 of the first transistor 120 together with the second source electrode 133. Accordingly, the second capacitor electrode 152 can be electrically connected to the first node N1 between the first gate electrode 121 of the first transistor 120 and the second source electrode 133 of the second transistor 130.

The third capacitor electrode 153 is disposed on the passivation layer 113 and the planarization layer 114 so as to overlap the first capacitor electrode 151 and the second capacitor electrode 152. The third capacitor electrode 153 extends to the circuit area CA from the first electrode 161 of the light emitting diode 160 to overlap the first capacitor electrode 151 and the second capacitor electrode 152. The third capacitor electrode 153 can be integrally formed with the first electrode 161 of the light emitting diode 160 and can be electrically connected to the first source electrode 123 of the first transistor 120 through the first electrode 161. Accordingly, the third capacitor electrode 153 can be electrically connected to the second node N2 between the first transistor 120, the third transistor 140, and the light emitting diode 160.

In summary, the first capacitor electrode 151 of the storage capacitor 150 can be electrically connected to the first source electrode 123 of the first transistor 120 through the first active layer 122. The second capacitor electrode 152 can be integrally formed with the second active layer 132 and the second source electrode 133 to be electrically connected to the first gate electrode 121 of the first transistor 120. The third capacitor electrode 153 can be integrally formed with the first electrode 161 to be electrically connected to the first source electrode 123 of the first transistor 120.

In the display device 100 according to the exemplary embodiment of the present disclosure, the emission areas EA of the plurality of sub pixels SP are disposed in a zigzag pattern so that light leakage problem in accordance with the viewing angle can be minimized. Further, in the first direction in which the reference line RL extends, the emission areas EA and the circuit areas CA of the plurality of sub pixels SP can be alternately disposed. For example, at the other side of the reference line RL, the second circuit area CA2 is disposed between the first emission area EA1 and the third emission area EA3 and at one side of the reference line RL, the third circuit area CA3 can be disposed between the second emission area EA2 and the fourth emission area EA4. Further, in the second direction in which the scan line SL extends, the emission areas EA and the circuit areas CA of the plurality of sub pixels SP can be alternately disposed. For example, the first circuit area CA1 is disposed at one side of the first emission area EA1 of one first sub pixel SP1 and the first emission area EA1 of another first sub pixel SP1 can be disposed at one side of the first circuit area CAE In summary, the emission area EA of one sub pixel SP can be disposed to be spaced apart from the emission area EA of the other sub pixel SP with the circuit area CA therebetween. Accordingly, light emitted from one emission area EA and directed to the other emission area EA can be minimized by the plurality of circuit areas CA which enclose the one emission area EA. Accordingly, in the display device 100 according to the exemplary embodiment of the present disclosure, the plurality of circuit areas CA is disposed to enclose the plurality of emission areas EA so that each of the plurality of emission areas EA can be disposed to be spaced apart from another emission area EA. Therefore, the color mixture and display quality degradation due to the light leakage in accordance with a viewing angle can be minimized.

In the meantime, in the display device 100 according to the exemplary embodiment of the present disclosure, the plurality of sub pixels SP which emit light having the same color is disposed in the second direction so that the repair unit 162 can extend in the second direction. Further, the parasitic capacitance in the repair unit 162 can be minimized. When the repair unit 162 extends in the second direction, the repair unit 162 can intersect the reference line RL and the data lines DL. In this case, the buffer layer 111, the passivation layer 113, and the planarization layer 114 are disposed between the reference line RL and the repair unit 162 and between the data line DL and the repair unit 162. Therefore, a sufficient distance between the reference line RL and the repair unit 162 and between the data line DL and the repair unit 162 is ensured and the parasitic capacitance can be minimized.

Further, in the display device 100 according to the exemplary embodiment of the present disclosure, the circuit area CA of each of the plurality of sub pixels SP is disposed to be adjacent to the reference line RL and the reference line RL is disposed to be spaced apart from the data line DL with the circuit area CA therebetween. Therefore, the luminance non-uniformity can be improved. When the data line DL and the reference line RL overlap, a reference signal and a data signal can be distorted due to the parasitic capacitance. Further, since the display device 100 according to the exemplary embodiment of the present disclosure is a DRD structure display device 100, when the data line DL to which a data signal having a polarity which is periodically inverted is supplied and the reference line RL overlap, the distortion of the reference signal can become more serious in accordance with the polarity of the data signal. Further, the luminance can be irregularly obtained. Therefore, in the display device 100 according to the exemplary embodiment of the present disclosure, the reference line RL and the data lines DL are disposed at both sides of the circuit areas CA of the plurality of sub pixels SP so that the reference line RL and the data lines DL may not overlap. Accordingly, in the display device 100 according to the exemplary embodiment of the present disclosure, the reference line RL and the data lines DL are disposed to be spaced apart from each other with the circuit area CA therebetween so that the uniformity of the luminance is improved and the display quality is improved.

Hereinafter, an effect that the parasitic capacitance of the repair unit 162 of the present disclosure is minimized and the luminance is improved to be uniformly will be described in more detail with reference to FIG. 6.

Figure 6:
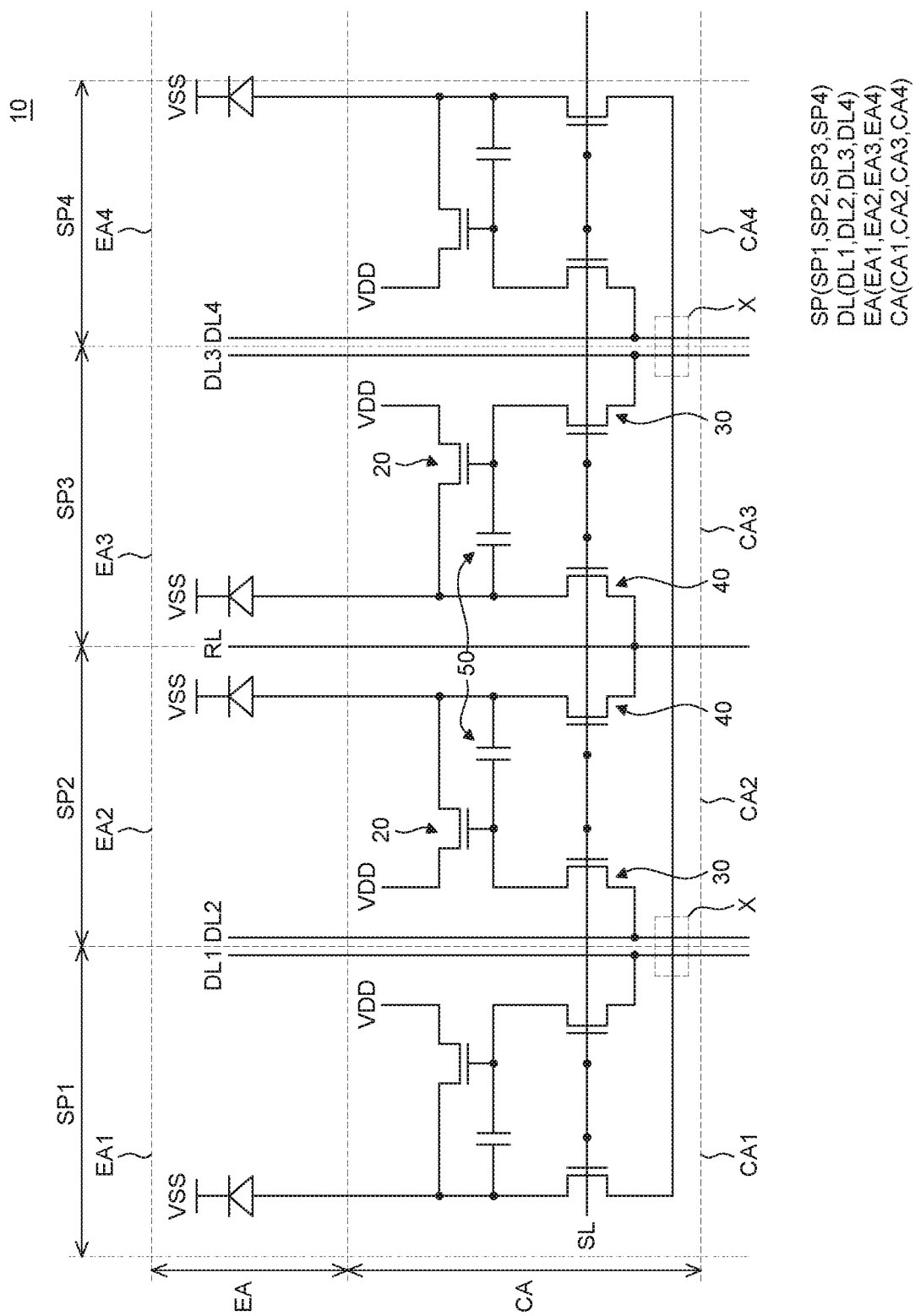
FIG. 6 is a circuit diagram of a plurality of sub pixels of a display device according to a comparative embodiment.

FIG. 6 is a circuit diagram of a plurality of sub pixels of a display device according to a comparative embodiment. Referring to FIG. 6, a driving circuit which drives each light emitting diode 60 of a plurality of sub pixels SP of a display device 10 according to the comparative embodiment includes a first transistor 20, a second transistor 30, a third transistor 40, a storage capacitor 50, a plurality of scan lines SL, a plurality of data lines DL, a plurality of power lines VDD and a reference line RL. As compared with the display device 100 of FIGS. 1 to 5, in the display device 10 according to the comparative embodiment, the plurality of sub pixels SP is connected to different data lines DL1, DL2, DL3, and DL4 and arrangement of emission areas EA and circuit areas CA is different.

Referring to FIG. 6, the display device 10 according to the comparative embodiment includes the first transistor 20, the second transistor 30, the third transistor 40, and the storage capacitor 50 and the scan lines SL, the data lines DL, the reference line DL, and the power lines VDD which are electrically connected to the first transistor 20, the second transistor 30, the third transistor 40, and the storage capacitor 50.

The plurality of sub pixels SP is disposed in one line along the second direction. Specifically, a second sub pixel SP2 is disposed at one side of a first sub pixel SP1, a third sub pixel SP3 is disposed at one side of the second sub pixel SP2, and a fourth sub pixel SP4 is disposed at one side of the third sub pixel SP3.

Further, the circuit areas CA and the emission areas EA of the plurality of sub pixels SP are disposed in one line along the second direction. In the second direction, the circuit areas CA of the plurality of sub pixels SP can be disposed to be adjacent to each other, and in the second direction, the emission areas EA of the plurality of sub pixels SP can be disposed to be adjacent to each other.

The reference line RL is disposed between the plurality of sub pixels SP. The reference line RL is disposed to extend in the first direction between the second sub pixel SP2 and the third sub pixel SP3 among the plurality of sub pixels SP. Further, the plurality of sub pixels SP can share one reference line RL. For example, the first sub pixels SP1, the second sub pixel SP2, the third sub pixel SP3, and the fourth sub pixel SP4 can share the same reference line RL.

The plurality of data lines DL is disposed between the plurality of sub pixels SP. A first data line DL1 and a second data line DL2 of the plurality of data lines DL are disposed to extend in the first direction between the first sub pixel SP1 and the second sub pixel SP2 to be electrically connected to the second transistors 30 of the first sub pixel SP1 and the second sub pixel SP2. The third data line DL3 and a fourth data line DL4 of the plurality of data lines DL are disposed to extend in the first direction between the third sub pixel SP3 and the fourth sub pixel SP4 to be electrically connected to the second transistors 30 of the third sub pixel SP3 and the fourth sub pixel SP4.

In the display device 10 according to the comparative embodiment, the emission areas EA and the circuit areas CA of the plurality of sub pixels SP are disposed in one line along the second direction. The reference line RL extending along the first direction is disposed only between the second sub pixel SP2 and the third sub pixel SP3 among the plurality of sub pixels SP. Therefore, in order to electrically connect the third transistors 40 disposed in the circuit areas CA of the first sub pixel SP1 and the fourth sub pixel SP4 to the reference line RL, a part of the reference line RL can extend along the second direction. However, as the part of the reference line RL extends in the second direction, the reference line RL can intersect the plurality of data lines DL. For example, in the X area of FIG. 6, the reference line RL and the plurality of data lines DL can intersect. For example, a part of the reference line RL can overlap each of the plurality of data lines DL.

In the meantime, in the X area where the data line DL and the reference line RL overlap, a parasitic capacitance can be generated to cause the distortion of the reference signal, and the like. Further, the parasitic capacitance causes ripple phenomenon, for example, noises, and the ripple phenomenon cause a dim phenomenon in which the luminance is not uniform, thereby degrading the display quality.

Further, in the DRD structure in which one pair of sub pixels SP shares one data line DL and the polarity of the data signal is periodically inverted, the ripple phenomenon and the dim phenomenon can become more serious. Specifically, at the moment when the polarity of the data signal is changed, a fluctuation range of the data signal is significant so that the ripple phenomenon and the dim phenomenon occur to degrade the display quality.

In the display device 10 according to the comparative embodiment, the plurality of sub pixels SP is disposed along the second direction and four sub pixels SP share one reference line RL extending in the first direction at an intermediate point of four sub pixels SP. Therefore, in order to supply the reference signal to the first sub pixel SP1 and the fourth sub pixel SP4 which are not adjacent to the reference line RL, a part of the reference line RL can extend in the second direction. As the part of the reference line RL extends in the second direction, the reference line RL can intersect the plurality of data lines DL in the X area. In this case, as described above, when the data lines DL and the reference line RL overlap, the ripple phenomenon and the dim phenomenon occur to degrade the display quality.

In contrast, in the display device 100 according to the exemplary embodiment of the present disclosure, the plurality of sub pixels SP is disposed along the first direction as the same as the reference line RL and the circuit area CA of each of the plurality of sub pixels SP is adjacent to the reference line RL. Further, the plurality of data lines DL can be disposed to be spaced apart from the reference line RL with the circuit area CA therebetween. Therefore, all the circuit areas CA of the plurality of sub pixels SP are disposed to be adjacent to the reference line RL to be connected to the reference line RL so that the reference line RL does not need to extend in the second direction and the data lines DL may not intersect the reference line RL.

Accordingly, in the display device 100 according to the exemplary embodiment of the present disclosure, the circuit areas CA of the plurality of sub pixels SP are disposed between the reference line RL and the plurality of data lines DL to minimize the degradation of the display quality caused by the ripple phenomenon and the dim phenomenon. The reference line RL is disposed to be adjacent to all the circuit areas CA of the plurality of sub pixels SP. For example, the first circuit area CA1 is disposed to be adjacent to the reference line RL at the other side of the first circuit area CAL and the second circuit area CA2 is disposed to be adjacent to the reference line RL at one side of the second circuit area CA2.

Further, the plurality of data lines DL can be disposed to be spaced apart from the reference line RL with the circuit areas CA of the plurality of sub pixels SP therebetween. For example, the first circuit area CA1 is disposed between the first data line DL1 and the reference line RL and the second circuit area CA2 is disposed between the second data line DL2 and the reference line RL. Since the plurality of data lines DL and the reference line RL are disposed to be spaced apart from each other with the circuit areas CA therebetween, the plurality of data lines DL and the reference line RL may not overlap each other. When the reference line RL and the plurality of data lines DL overlap, the luminance non-uniformity can be caused due to the parasitic capacitance between the data line and the reference line so that the display quality can be degraded. Specifically, in the case of the DRD structure like the display device 100 according to the exemplary embodiment of the present disclosure, the ripple phenomenon and the dim phenomenon become more serious due to the data signal having a polarity which is periodically inverted. Therefore, the reference line RL can be disposed so as not to overlap the plurality of data lines DL. Accordingly, in the display device 100 according to the exemplary embodiment of the present disclosure, the reference line RL and the plurality of data lines DL are disposed at both sides of the circuit areas CA of the plurality of sub pixels SP so that the reference line RL and the plurality of data lines DL do not overlap. Further, the parasitic capacitance between the reference line RL and the plurality of data lines DL and the display quality degradation thereby can be minimized.

In the meantime, in the display device 10 according to the comparative embodiment, the sub pixels SP which emit light having the same color are disposed to be adjacent to each other in the first direction. In the display device 10 with the above-described structure, the repair unit can extend to be directed to the circuit areas CA of the plurality of sub pixels SP adjacent in the first direction. For example, in the display device 10 according to the comparative embodiment, the repair unit can be disposed to extend in the first direction.

Therefore, in the display device 10 according to the comparative embodiment, the repair unit can extend in the first direction so that a part of the repair unit can overlap the scan line SL. As described above with reference to FIGS. 1 to 5, the scan line SL is disposed between the gate insulating layer and the passivation layer so that in the display device 10 according to the comparative embodiment, the scan line SL and the repair unit can be disposed to be spaced apart from each other with the passivation layer and the planarization layer therebetween.

In the meantime, in the display device 100 according to the exemplary embodiment of the present disclosure, the sub pixels SP which emit light having the same color are disposed along the second direction. In the display device 100 with the above-described structure, the repair unit 162 can extend to be directed to the circuit areas CA of the sub pixels SP adjacent in the second direction. For example, in the display device 100 according to the exemplary embodiment of the present disclosure, the repair unit 162 can be disposed to extend in the second direction.

Therefore, in the display device 100 according to the exemplary embodiment of the present disclosure, the repair unit 162 can be disposed to extend in the second direction, so that a part of the repair unit 162 can overlap the power lines VDD and the data lines DL. As described above with reference to FIGS. 1 to 5, the power lines VDD and the data lines DL are disposed between the substrate 110 and the buffer layer 111. Therefore, in the display device 100 according to the exemplary embodiment of the present disclosure, the power lines VDD and the data lines DL and the repair unit 162 can be disposed to be spaced apart from each other with the buffer layer 111, the passivation layer 113, and the planarization layer 114 therebetween.

Accordingly, in the display device 100 according to the exemplary embodiment of the present disclosure, the repair unit 162 extends in the second direction to minimize the parasitic capacitance of the repair unit 162. Specifically, in the display device 100 according to the exemplary embodiment of the present disclosure, the emission areas EA and the circuit areas CA of a plurality of sub pixels SP which emit the light having the same color, among the plurality of sub pixels SP are disposed along the second direction. For example, in the first sub pixel SP1 which is the green sub pixel, the first circuit area CA1 is disposed at one side of the first emission area EA1, and the first emission area EA1 and the first circuit area CA1 of another first sub pixel SP1 can be disposed at one side of the first circuit area CA.

Further, the repair unit 162 extends to the circuit area CA of a sub pixel SP which emits the light having the same color, among adjacent sub pixels SP along the second direction. As the repair unit 162 extends in the second direction, the repair unit 162 can intersect the reference line RL and the data lines DL. Further, even though the repair unit 162 overlaps the reference line RL and the data lines DL, the buffer layer 111, the passivation layer 113, and the planarization layer 114 are disposed between the repair unit 162 and the reference line RL and between the repair unit 162 and the data lines DL. Therefore, a sufficient distance between the repair unit 162 and the reference line RL and between the repair unit 162 and the data lines DL can be ensured.

In contrast, in the display device 10 according to the comparative embodiment, the emission areas EA and the circuit areas CA of a plurality of sub pixels SP which emit the light having the same color, among the plurality of sub pixels SP are disposed along the first direction. For example, in the first sub pixel SP1 which is the green sub pixel, the first circuit area CA1 of another first sub pixel SP1 can be disposed below the first circuit area CAE Further, the repair unit can extend to the circuit area CA of a sub pixel which emits the light having the same color, among adjacent sub pixels SP, along the first direction. Further, as the repair unit extends in the first direction, the repair unit can intersect the scan lines SL. Further, the repair unit can be disposed to be spaced apart from the scan lines SL with the passivation layer and the planarization layer therebetween.

In summary, in the display device 10 according to the comparative embodiment, the repair unit is disposed to be spaced apart from the scan lines SL with the passivation layer and the planarization layer therebetween. However, in the display device 100 according to the exemplary embodiment of the present disclosure, the repair unit 162 is disposed to be spaced apart from the data lines DL with the buffer layer 111, the passivation layer 113, and the planarization layer 114 therebetween. In this case, the smaller the distance between two components, the larger the parasitic capacitance. Accordingly, as compared with the display device 10 according to the comparative embodiment, in the display device 100 according to the exemplary embodiment of the present disclosure, the buffer layer 111 is further disposed between the repair unit 162 and the data lines DL and between the repair unit 162 and the reference line RL in addition to the passivation layer 113 and the planarization layer 114. Therefore, a sufficient distance between the repair unit 162 and the reference line RL and between the repair unit 162 and the data lines DL is ensured so that the parasitic capacitance can be reduced.

Accordingly, in the display device 100 according to the exemplary embodiment of the present disclosure, as the sub pixels SP which emit the light having the same color are disposed along the second direction, the repair unit 162 can extend in the second direction. Further, the repair unit 162 intersects the power line VDD and the data line DL which are disposed to be most adjacent to the substrate 110, instead of the scan lines SL so that the parasitic capacitance between the repair unit 162 and the data lines DL and the reference line RL and the degradation of the display quality can be minimized.

The exemplary embodiments of the present disclosure can also be described as follows:

According to an aspect of the present disclosure, there is provided a display device. The display device includes a substrate on which a plurality of reference lines extending in a first direction is disposed, a plurality of first sub pixels which includes a first circuit area disposed at one side of the plurality of reference lines and a first emission area disposed at the other side of the plurality of reference lines, a plurality of second sub pixels which includes a second emission area disposed at one side of the plurality of reference lines and a second circuit area disposed at the other side of the plurality of reference lines, a plurality of first data lines which extends in the first direction and is disposed to be spaced apart from the plurality of reference lines, and a plurality of second data lines which extends in the first direction and is disposed to be spaced apart from the plurality of reference lines. In the first direction, the plurality of first sub pixels and the plurality of second sub pixels are alternately disposed. The first circuit area is disposed between the plurality of first data lines and the plurality of reference lines and the second circuit area is disposed between the plurality of second data lines and the plurality of reference lines.

In the first direction, the first emission area can be adjacent to the second circuit area and the second emission area can be adjacent to the first circuit area, and in a second direction which is perpendicular to the first direction, the first emission area can be adjacent to the first circuit area and the second emission area can be adjacent to the second circuit area.

The first circuit area and the second emission area can be disposed between the plurality of first data lines and the plurality of reference lines, and the first emission area and the second circuit area are disposed between the plurality of reference lines and the plurality of second data lines.

The plurality of reference lines may not do intersect the plurality of first data lines and the plurality of second data lines.

The display device can further include a plurality of first power lines which extends in the first direction, is spaced apart from the plurality of reference lines, and is adjacent to the plurality of first data lines, a plurality of second power lines which extends in the first direction, is spaced apart from the plurality of reference lines, and is adjacent to the plurality of second data lines, a first driving circuit which is disposed in the first circuit area and is electrically connected to the plurality of first data lines and the plurality of first power lines, and a second driving circuit which is disposed in the second circuit area and is electrically connected to the plurality of second data lines and the plurality of second power lines. Each of the plurality of reference lines can be simultaneously electrically connected to the first driving circuit and the second driving circuit which are the most adjacent to the plurality of reference lines.

The display device can further include a first light emitting diode which is disposed in the first emission area and is electrically connected to the first driving circuit and a second light emitting diode which is disposed in the second emission area and is electrically connected to the second driving circuit.

The display device can further include a first repair unit which extends toward another reference line disposed at the other side of one reference line from the first light emitting diode adjacent to the one reference line among the plurality of reference lines, and a second repair unit which extends toward another reference line disposed at one side of the one reference line from the second light emitting diode adjacent to the one reference line. At least a part of the first repair unit can overlap the most adjacent second data line among the plurality of second data lines and at least a part of the second repair unit can overlap the most adjacent first data line among the plurality of first data lines.

An end portion of the first repair unit can overlap the first driving circuit disposed between the one reference line and another reference line disposed at the other side of one reference line, and an end portion of the second repair unit can overlap the second driving circuit disposed between the one reference line and another reference line disposed at one side of one reference line.

The display device can further include a plurality of scan lines which extends in a second direction perpendicular to the first direction and is disposed on the plurality of first data lines and the plurality of second data lines. The first repair unit and the second repair unit can extend in the second direction, and the first repair unit and the second repair unit can be spaced apart from the plurality of scan lines.

The display device can further include a plurality of third sub pixels which includes a third circuit area disposed at one side of the plurality of reference lines and a third emission area disposed at the other side of the plurality of reference lines, and a plurality of fourth sub pixels which includes a fourth emission area disposed at one side of the plurality of reference lines and a fourth circuit area disposed at the other side of the plurality of reference lines. In the first direction, the plurality of first sub pixels, the plurality of second sub pixels, the plurality of third sub pixels, and the plurality of fourth sub pixels can be alternately disposed.

In the first direction, the second emission area can be disposed between the first circuit area and the third circuit area, and in the first direction, the third emission area can be disposed between the second circuit area and the fourth circuit area.

The plurality of first sub pixels can be green sub pixels, the plurality of second sub pixels can be red sub pixels, the plurality of third sub pixels can be white sub pixels, and the plurality of fourth sub pixels can be blue sub pixels.

According to another aspect of the present disclosure, there is provided a display device. The display device includes a substrate in which a plurality of sub pixels including a red sub pixel, a green sub pixel, a blue sub pixel, and a white sub pixel is defined, a plurality of reference lines which extends in a first direction and overlaps the plurality of sub pixels, a plurality of data lines which extends in the first direction and is disposed between the plurality of sub pixels, a red light emitting diode which is disposed at one side of the plurality of reference lines, in the red sub pixel, a blue light emitting diode which is disposed at one side of the plurality of reference lines, in the blue sub pixel, a green light emitting diode which is disposed at the other side of the plurality of reference lines, in the green sub pixel, and a white light emitting diode which is disposed at the other side of the plurality of reference lines, in the white sub pixel. The red light emitting diode, the blue light emitting diode, the green light emitting diode, and the white light emitting diode which are adjacent to one reference line among the plurality of reference lines form a zigzag pattern.

In the first direction, the green sub pixel or the white sub pixel can be disposed between the red sub pixel and the blue sub pixel, and in the first direction, the red sub pixel or the blue sub pixel can be disposed between the green sub pixel and the white sub pixel.

The red light emitting diode or the green light emitting diode can be disposed between the plurality of data lines and the plurality of reference lines, and the plurality of data lines and the plurality of reference lines may not do overlap.

The display device can further include a red driving circuit which is disposed at the other side of the plurality of reference lines, in the red sub pixel, a blue driving circuit which is disposed at the other side of the plurality of reference lines, in the blue sub pixel, a green driving circuit which is disposed at one side of the plurality of reference lines, in the green sub pixel, and a white driving circuit which is disposed at one side of the plurality of reference lines, in the white sub pixel. The red driving circuit, the blue driving circuit, the green driving circuit, and the white driving circuit adjacent to one reference line among the plurality of reference lines can be simultaneously electrically connected to the one reference line, the red driving circuit and the blue driving circuit can be electrically connected to a data line disposed at the other side of the plurality of reference lines, among the plurality of data lines, and the green driving circuit and the white driving circuit can be electrically connected to a data line disposed at one side of the plurality of reference lines, among the plurality of data lines.

The red driving circuit and the blue driving circuit can share one data line among the plurality of data lines, and the green driving circuit and the white driving circuit can share the other one data line among the plurality of data lines.

The red light emitting diode can include an anode which is electrically connected to the red driving circuit and a red repair unit extending to a red driving circuit of an adjacent red sub pixel from the anode, and a part of the red repair unit can overlap the plurality of data lines, and the red repair unit can be spaced apart from the plurality of reference lines.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:
1. A display device, comprising:
a substrate on which a plurality of reference lines extending in a first direction is disposed;
a plurality of first sub pixels, each of the plurality of first sub pixels including a first circuit area disposed at one side of a corresponding reference line among the plurality of reference lines and a first emission area disposed at another side of the corresponding reference line among the plurality of reference lines;
a plurality of second sub pixels, each of the plurality of second sub pixels including a second emission area disposed at the one side of the corresponding reference line among the plurality of reference lines and a second circuit area disposed at the another side of the corresponding reference line among the plurality of reference lines;
a plurality of first data lines which extends in the first direction and is disposed to be spaced apart from the plurality of reference lines;
a plurality of second data lines which extends in the first direction and is disposed to be spaced apart from the plurality of reference lines;
a plurality of first power lines which extends in the first direction, is spaced apart from the plurality of reference lines, and is adjacent to the plurality of first data lines;

a plurality of second power lines which extends in the first direction, is spaced apart from the plurality of reference lines, and is adjacent to the plurality of second data lines;

a first driving circuit which is disposed in the first circuit area and is electrically, connected to the plurality of first data lines and the plurality of first power lines; and a second driving circuit which is disposed in the second circuit area and is electrically connected to the plurality of second data lines and the plurality of second power lines, wherein in the first direction, the plurality of first sub pixels and the plurality of second sub pixels are alternately disposed, wherein, in first sub pixels and second sub pixels which are alternately disposed in the first direction, the first circuit area and the second emission area are disposed between a corresponding first data line among the plurality of first data lines and a corresponding reference line among the plurality of reference lines and the second circuit area and the first emission area are disposed between a corresponding second data line among the plurality of second data lines and the corresponding reference line among the plurality of reference lines, and wherein each of the plurality of reference lines is simultaneously electrically connected to the first driving circuit and the second driving circuit which are the most adjacent to the plurality of reference lines.

2. The display device according to claim 1, wherein in the first direction, the first emission area is adjacent to the second circuit area, and the second emission area is adjacent to the first circuit area, and in a second direction which is perpendicular to the first direction, the first emission area is adjacent to the first circuit area, and the second emission area is adjacent to the second circuit area.

3. The display device according to claim 1, wherein the first circuit area and the second emission area are disposed between the plurality of first data lines and the plurality of reference lines.

4. The display device according to claim 1, further comprising:

a first light emitting diode which is disposed in the first emission area and is electrically connected to the first driving circuit; and a second light emitting diode which is disposed in the second emission area and is electrically connected to the second driving circuit.

5. The display device according to claim 4, further comprising:

a first repair unit which extends toward another reference line disposed at the other side of one reference line from the first light emitting diode adjacent to the one reference line among the plurality of reference lines; and a second repair unit which extends toward another reference line disposed at one side of the one reference line from the second light emitting diode adjacent to the one reference line, wherein at least a part of the first repair unit overlaps the most adjacent second data line among the plurality of second data lines and at least a part of the second repair unit overlaps the most adjacent first data line among the plurality of first data lines.

6. The display device according to claim 5, wherein an end portion of the first repair unit overlaps the first driving circuit disposed between the one reference line and another reference line at the other side of one reference line, and an end portion of the second repair unit overlaps the second driving circuit disposed between the one reference line and another reference line at one side of one reference line.

7. The display device according to claim 5, further comprising:

a plurality of scan lines which extends in a second direction perpendicular to the first direction and is disposed on the plurality of first data lines and the plurality of second data lines, wherein the first repair unit and the second repair unit are arranged in the second direction, and the first repair unit and the second repair unit are spaced apart from the plurality of scan lines.

8. The display device according to claim 1, further comprising:

a plurality of third sub pixels which includes a third circuit area disposed at the one side of the plurality of reference lines and a third emission area disposed at the another side of the plurality of reference lines; and a plurality of fourth sub pixels which includes a fourth emission area disposed at the one side of the plurality of reference lines and a fourth circuit area disposed at the other side of the plurality of reference lines, wherein in the first direction, the plurality of first sub pixels, the plurality of second sub pixels, the plurality of third sub pixels, and the plurality of fourth sub pixels are alternately disposed.

9. The display device according to claim 8, wherein in the first direction, the second emission area is disposed between the first circuit area and the third circuit area, and in the first direction, the third emission area is disposed between the second circuit area and the fourth circuit area.

10. The display device according to claim 8, wherein the plurality of first sub pixels is green sub pixels, the plurality of second sub pixels is red sub pixels, the plurality of third sub pixels is white sub pixels, and the plurality of fourth sub pixels is blue sub pixels.

11. A display device, comprising:

a substrate in which a plurality of sub pixels including a red sub pixel, a green sub pixel, a blue sub pixel, and a white sub pixel is defined;

a plurality of reference lines which extends in a first direction and overlaps the plurality, of sub pixels;

a plurality of data lines which extends in the first direction and is disposed between the plurality of sub pixels;

a red light emitting diode which is disposed at one side of one reference line among the plurality of reference lines, in the red sub pixel;

a blue light emitting diode which is disposed at the one side of the one reference line among the plurality of reference lines, in the blue sub pixel;

a green light emitting diode which is disposed at another side of the one reference line among the plurality of reference lines, in the green sub pixel; and a white light emitting diode which is disposed at the another side of the one reference line among the plurality of reference lines, in the white sub pixel, wherein the red light emitting diode, the blue light emitting diode, the green light emitting diode, and the white light emitting diode which are disposed in the first direction at both sides of the one reference line among the plurality of reference lines form a zigzag pattern.

12. The display device according to claim 11, wherein in the first direction, the green sub pixel or the white sub pixel is disposed between the red sub pixel and the blue sub pixel, and in the first direction, the red sub pixel or the blue sub pixel is disposed between the green sub pixel and the white sub pixel.

13. The display device according to claim 12, wherein the red light emitting diode or the green light emitting diode is disposed between the plurality of data lines and the plurality of reference lines, and the plurality of data lines and the plurality of reference lines do not overlap.

14. The display device according to claim 11, further comprising:

a red driving circuit which is disposed at the other side of the plurality of reference lines, in the red sub pixel;

a blue driving circuit which is disposed at the other side of the plurality of reference lines, in the blue sub pixel;

a green driving circuit which is disposed at one side of the plurality of reference lines, in the green sub pixel; and a white driving circuit which is disposed at one side of the plurality of reference lines, in the white sub pixel, wherein the red driving circuit, the blue driving circuit, the green driving circuit; and the white driving circuit adjacent to one reference line among the plurality of reference lines are simultaneously electrically connected to the one reference line, the red driving circuit and the blue driving circuit are electrically connected to a data line disposed at the other side of the plurality of reference lines, among the plurality of data lines, and the green driving circuit and the white driving circuit are electrically connected to a data line disposed at one side of the plurality of reference lines, among the plurality of data lines.

15. The display device according to claim 14, wherein the red driving circuit and the blue driving circuit share one data line among the plurality of data lines, and the green driving circuit and the white driving circuit share the other one data line among the plurality of data lines.

16. The display device according to claim 14, wherein the red light emitting diode includes:

an anode which is electrically connected to the red driving circuit and a red repair unit extending to a red driving circuit of an adjacent red sub pixel from the anode, and a part of the red repair unit overlaps the plurality of data lines, and the red repair unit is spaced apart from the plurality of reference lines.

* * * * *